United States Patent
Gielis et al.

(10) Patent No.: US 6,175,269 B1
(45) Date of Patent: Jan. 16, 2001

(54) DEMODULATION UNIT AND METHOD OF DEMODULATING A QUADRATURE

(75) Inventors: Gerardus C. M. Gielis; Rudy J. Van De Plassche, both of Eindhoven (NL)

(73) Assignee: U.S. Philips Corporation, New York, NY (US)

(*) Notice: Under 35 U.S.C. 154(b), the term of this patent shall be extended for 0 days.

(21) Appl. No.: 09/196,089

(22) Filed: Nov. 19, 1998

(30) Foreign Application Priority Data

Nov. 21, 1997 (EP) .................................. 97203648

(51) Int. Cl.[7] ........................... H03D 3/00; H03L 7/00
(52) U.S. Cl. ...................... 329/306; 329/346; 331/12
(58) Field of Search ........................ 329/302, 358, 329/306, 346, 323, 308, 307, 304; 324/118; 348/507, 726; 455/293, 263, 264, 207, 214; 331/12; 375/327, 324

(56) References Cited

U.S. PATENT DOCUMENTS 5,230,011   7/1993   Gielis et al. .
5,696,797 * 12/1997   Bucher et al. ................. 375/344
5,784,414   7/1998   Bruekers et al. .

FOREIGN PATENT DOCUMENTS

0579100A1   1/1994   (EP) .

OTHER PUBLICATIONS

PHN 15,248, U.S. Serial No. 08/704,200, Filed: Aug. 28, 1996.

* cited by examiner

*Primary Examiner*—Benny Lee
*Assistant Examiner*—Kimberly Glenn

(57) ABSTRACT

To demodulate a quadrature input signal ($S_i$) (for example, frequency shift) a demodulation unit (DEM) is used, comprising a PLL (P) having a complex mixer (M) and a controlled oscillator (V). Normally, a limiter has to be used to keep the loop gain independent of the amplitude of the quadrature input signal. In the PLL, a divider (DEL) is coupled between the mixer (M) and the oscillator (V) to divide the two mixed components ($S_{m1}$, $S_{m2}$) of the quadrature signal supplied by the mixer.

9 Claims, 1 Drawing Sheet

DEMODULATION UNIT AND METHOD OF DEMODULATING A QUADRATURE

BACKGROUND OF THE INVENTION

The invention relates to a demodulation unit for demodulating a quadrature input signal having at least two components, comprising a controlled oscillator for supplying a quadrature oscillator signal in dependence upon a control signal, and a mixer for mixing the quadrature input signal with the quadrature oscillator signal from the controlled oscillator and for supplying at least two mixed components, the mixer and the oscillator being incorporated in a PLL.

The invention also relates to a divider and a mixer for use in such a demodulation unit and to a receiver provided with such a demodulation unit.

The invention further relates to a method of demodulating a quadrature input signal having at least two components, wherein a quadrature oscillator signal is supplied in dependence upon a control signal and the quadrature input signal is mixed with the quadrature oscillator signal, and wherein at least two mixed components are supplied.

Such a demodulation unit and method may be used for, for example demodulating both AM and FM-modulated signals for radio, television, and communication receivers, etc., and for, for example "zero-IF" generation for QAM/QPSK signals and VSB signals, in which the PLL then comprises, for example, a COSTAS loop.

In addition to a synchronous demodulation function, such a demodulation unit also has a frequency-shift function.

In the present invention, a quadrature signal is also understood to be a real signal, which is a simplification of the signal to one of the two axes (X,Y) of the quadrature signal, in which both components are either equal or one of the components is zero.

A demodulation unit of this type is known from European patent application EP-A 0 579 100. This application describes a demodulation unit which comprises a PLL with a quadrature mixer and a controlled oscillator. This demodulation unit is intended to regain the phase and amplitude information of the carrier from the incoming signal.

A drawback of such a demodulation unit is that it is not very well possible to demodulate both FM and AM signals without taking extra measures as regards filtering, etc. Such a demodulation unit may also have acquisition problems, inter alia, due to amplitude variations.

To eliminate amplitude variations of the input signal, an extra bandpass filter and a limiter will have to be used for generating the carrier signal by means of the PLL. When the amplitude of the incoming signal varies, the lock-in range of the PLL will vary. Moreover, an amplitude variation of the control signal results in phase modulation of the carrier signal, which will distort the demodulated output signal.

If the PLL is used as an FM demodulator (for example, for TV sound), the amplitude variation of the input signal will result in a distortion of the demodulated output signal.

In a known digital or analog PLL, the limiter and filtering function must be incorporated in the carrier-generating circuit for demodulating AM signals. When demodulating FM signals, the limiter precedes the PLL so as to eliminate unwanted amplitude variations.

SUMMARY OF THE INVENTION

It is an object of the invention to obviate the above-mentioned drawbacks. To this end, a demodulation unit according to the invention is characterized in that the PLL also comprises a divider for dividing the at least two mixed components by each other and for supplying the output signal as a control signal to the oscillator, and a filtering unit for filtering one or more components and/or signals.

By making use of a divider in the PLL for dividing the two components by each other, amplitude variations of the input signal will be prevented from causing demodulation distortion or acquisition problems. By eliminating the amplitude variation, the loop gain and, hence, the lock-in range remain constant. Moreover, by performing the division in the PLL, it is no longer necessary to use a limiter and/or extra filtering function for demodulating AM or FM signals.

The invention may be used in both digital and analog complex demodulation units.

In one embodiment, the divider may be implemented as a linear CORDIC preventing a division by zero. In one embodiment, the mixer may be implemented as a circular CORDIC. A CORDIC (CO-ordinate Rotation Digital Computer) is known per se from, for example U.S. Pat. No. 5,230,011 (PHN 13.500) and U.S. patent application Ser. No. 08/704200 (PHN 15.428). In these implementations, a very efficient digital embodiment of a demodulation unit is obtained.

A embodiment in which the filtering unit has first and second low pass filters between the mixer and the divider.

The advantage that each mixed component is separately filtered for filtering the sum frequency(ies) which have been added by mixing for the case where the input signals are real signals. If the input signals are complex signals, but not ideal signals, the components should also be filtered before the division takes place. Furthermore, the filters have the customary loop filter function of a PLL.

According to the invention, a receiver comprises such a demodulation unit.

A method according to the invention is characterized by dividing the at least two mixed components by each other and supplying the output signal as a control signal for generating the oscillator signal, and by filtering one or more components and/or signals. In an integrated solution, the different functions may be incorporated in a CPU, wherein the division in the control loop prevents amplitude variations of the input signal from influencing the demodulated signal.

These and other aspects of the invention are apparent from and will be elucidated with reference to the embodiments described hereinafter.

DESCRIPTION OF THE PREFERRED EMBODIMENTS

Figure 1:
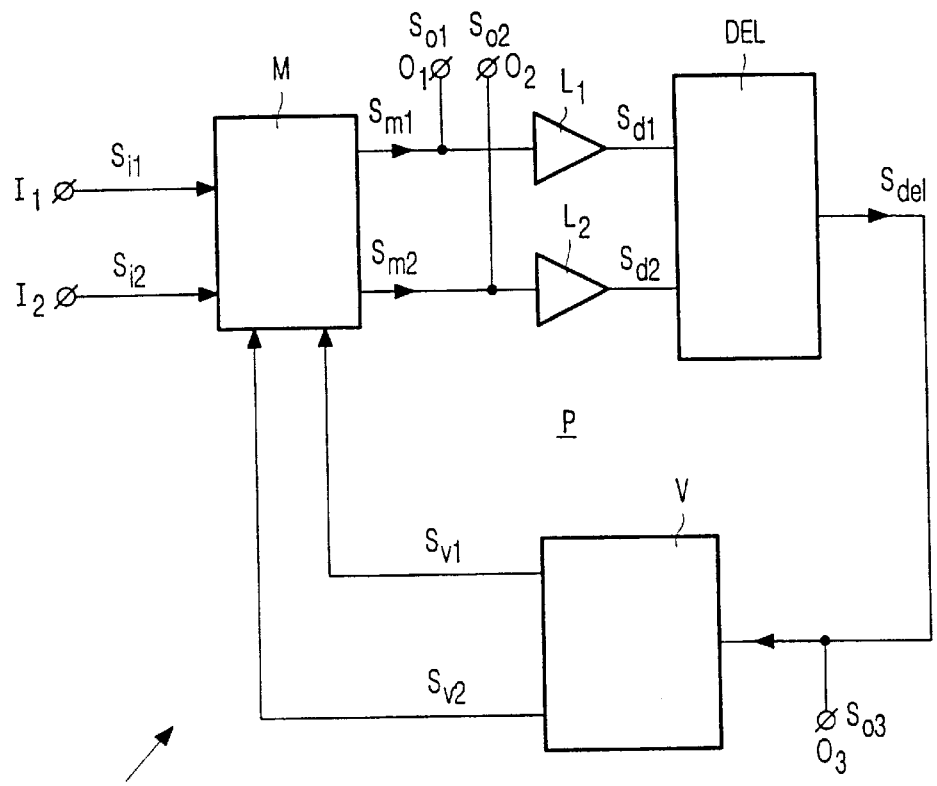
FIG. 1 is a block diagram of an embodiment of a demodulation unit according to the invention.

FIG. 1 is a block diagram of an embodiment of a demodulation unit DEM according to the invention.

Inputs $I_1$ and $I_2$ of the demodulation unit receive a complex input signal $S_i$ which consists of the components $S_{i1}$ and $S_{i2}$. These components are applied to a mixer M. In this mixer, these components are mixed with components $S_{v1}$ and $S_{v2}$ of a quadrature oscillator signal $S_v$ from a controlled oscillator V.

Outputs of the mixer M supply mixed components $S_{m1}$ and $S_{m2}$, which outputs are coupled to outputs $O_1$ and $O_2$ for supplying output signals $S_{o1}$ and $S_{o2}$ (for example, complex AM signals) and, in this embodiment, are coupled via low-pass filters $L_1$ and $L_2$ to a divider DEL for dividing the two filtered mixed components $S_{d1}$ and $S_{d2}$ one by the other.

The output signal of the divider $S_{del}$ is coupled to the controlled oscillator V. The output of the divider is also coupled to a third output $O_3$ of the demodulation unit DEM for supplying an output signal $S_{o3}$ (for example, an FM signal).

In this embodiment, the mixer M, the low-pass filters $L_1$ and $L_2$, the divider DEL and the controlled oscillator V jointly constitute a PLL P. The inputs $I_1$ and $I_2$ of the demodulation unit DEM receive complex input signals from, for example a complex input filter (not shown) as described in, for example U.S. Pat. No. 5,784,414, which is herein incorporated by reference.

In this embodiment, the mixer M is a complex mixer and may be, for example a circular CORDIC as described in U.S. Pat. No. 5,230,011 (PHN 13.500) and U.S. patent application Ser. No. 08/704200 (PHN 15.428), both of which are herein incorporated by reference.

Figure 2:
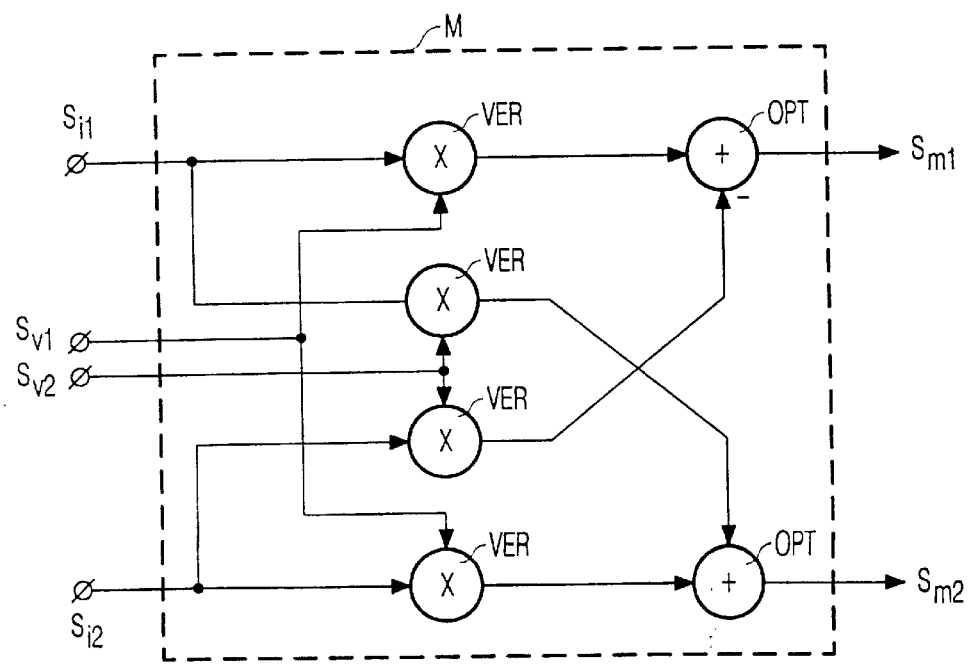
FIG. 2 is a block diagram of an embodiment of a mixer according to the invention.

FIG. 2 shows an embodiment of the mixer M in greater detail. In this embodiment, the mixer M comprises multipliers VER and adders OPT.

In the mixer M, the input signals $S_{i1}$ and $S_{i2}$ are mixed with the oscillator signals $S_{v1}$ and $S_{v2}$ from the controlled oscillator V (see FIG. 1). The signals $S_{m1}$ and $S_{m2}$ are then obtained:

$$S_{m1} = S_{i1} * S_{v1} - S_{i2} * S_{v2}$$

$$S_{m2} = S_{i2} * S_{v1} + S_{i1} * S_{v2}$$

If $S_{i1} = \sin\alpha$, $S_{i2} = \cos\alpha$ and $S_{v1} = \cos\beta$, $S_{v2} = \sin\beta$, this yeilds $$S_{m1} = \sin\alpha\cos\beta - \cos\alpha\sin\beta = \sin(\alpha-\beta)$$

$$S_{m2} = \cos\alpha\cos\beta + \sin\alpha\sin\beta = \cos(\alpha-\beta)$$

For a real input signal $S_i$ and hence $S_{i1} = S_{i2}$, the above-mentioned formulas thus yield both the difference and the sum frequency.

The mixer M is used, inter alia, for shifting the frequency, for example to the baseband. This is achieved by mixing the components $S_{i1}$ and $S_{i2}$ of the input signal $S_i$ with the components $S_{v1}$ and $S_{v2}$ of the oscillator signal $S_v$ from the controlled oscillator V.

For demodulating AM signals, no separate circuits for generating the carrier and demodulating the signal are required in the demodulation unit according to the invention. In an embodiment of the mixer as a circular CORDIC, these functions are interwoven because the multipliers for the demodulation function are also product detectors for the PLL. For example, AM signals are supplied at the outputs $O_1$ and $O_2$ of the demodulation unit DEM (see FIG. 1.).

The signals $S_{m1}$ and $S_{m2}$ are subsequently filtered by means of the low-pass filters $L_1$ and $L_2$ (see FIG. 1).

By incorporating the low-pass filters in the two signal paths, it will be possible to separately filter each mixed component for filtering the sum frequency(ies) which have been added by mixing for the case where the input signals are real signals. If the input signals are complex signals, but not ideal signals, the components should also be filtered before the division takes place.

Furthermore, the filters have the customary loop filter function of a PLL.

In this embodiment, the inputs of the divider DEL convey the signals $S_{d1}$ and $S_{d2}$. After division, the signal $S_{del}$ is obtained. The signal $S_{del}$ is applied to the controlled oscillator V and will be further available at the output O3 as signal $S_{o3}$ (for example, an FM signal).

The signals $S_{i2}$, $S_{m1}$, $S_{d1}$ and $S_{v1}$ represent the cos-component (in-phase component) of the relevant complex signal, and the signals $S_{i1}$, $S_{m2}$, $S_{d2}$ and $S_{v2}$ represent the sin-component (quadrature component) of the relevant complex signal. Accordingly, the divider DEL conducts the operation Sd1/Sd2.

By incorporating the divider DEL in the PLL, amplitude variations of the input signal $S_i$ are prevented from influencing the control signal ($S_{del}$) of the PLL and, hence, the lock-in range of the PLL.

The demodulation unit DEM according to the invention may be used in radio, television and communication receivers, etc. The demodulation unit may be used in, for example a receiver for receiving a modulated carrier with asymmetrical side bands (PHN 16.471), a receiver for receiving multistandard signals (PHN 16.489), etc.

The divider DEL may also be implemented with, for example a linear CORDIC providing also a safeguard for division by "0".

To improve the operation of the demodulation unit DEM and notably the PLL, it is advantageous to incorporate an extra control in the control loop, preventing the PLL from "jumping" between 0° and 180°, which impedes the lock-in. In this case, the output signal $S_{del}$ of the divider DEL is applied to the oscillator V via a multiplexer. The output of the multiplexer is fed back via a flipflop to a second input of the multiplexer.

In this embodiment, the sign bit of the signal $S_{d2}$ (the msb bit in a two's complement) is applied to the control input of the multiplexer, so that the multiplexer applies the signal $S_{del}$ to the oscillator V in the case of a positive signal $S_{d2}$ and applies the signal stored in the flipflop to the oscillator in the case of a negative signal $S_{d2}$. Consequently, the PLL will lock in much better and synchronize to, for example the zero-crossing of the tan function.

It is of course also possible to apply the signal $S_{del}$ in an unchanged form to the oscillator at a negative signal $S_{d2}$, and to apply the signal stored in the flipflop at a positive signal $S_{d2}$.

It will be evident that a demodulation unit, a divider and a mixer, a receiver, and a method according to the invention may be adapted in any way within the protective scope of the present invention.

Reference numerals in the claims should not be construed as limiting these claims.

Instead of the hardware embodiment shown, it is also possible to incorporate the different functions in a CPU. The functions are then software-controlled.

The invention provides the possibility of improving the operation of the demodulation unit and simultaneously simplifying the demodulation unit and the PLL. This is achieved by incorporating a divider in the PLL, with which variations of the PLL control signal due to amplitude variations of the input signal are prevented.

What is claimed is:

1. A demodulation unit for demodulating a quadrature input signal having at least two components, comprising
   a controlled oscillator for supplying a quadrature oscillator signal in dependence upon a control signal, and
   a mixer for mixing the quadrature input signal with the quadrature oscillator signal from the controlled oscillator, and for supplying at least two mixed components, comprising an in-phase component and a quadrature component, the mixer and the oscillator being incorporated in a PLL, characterized in that the PLL also comprises a divider for dividing the in-phase component by the quadrature component and for supplying the output signal as a control signal to the oscillator, and a filtering unit for filtering one or more components and/or signals.

2. A demodulation unit as claimed in claim 1, characterized in that the divider comprises a linear CORDIC.

3. A demodulation unit as claimed in claim 1, characterized in that the mixer comprises a circular CORDIC.

4. A demodulation unit as claimed in claim 1, characterized in that the filtering unit comprises a first and a second low-pass filter ($L_1$, $L_2$) which are coupled between the mixer and the divider.

5. A demodulation unit as claimed in claim 1, characterized in that the PLL comprises a multiplexer and applies the output signal of the divider to the controlled oscillator in the case of either a positive or a negative value of a mixed component received at one of the inputs of the divider.

6. A divider for use in a demodulation unit, characterized in that the divider is adapted to divide and in-phase component by a quadrature component and to supply the output signal as a control signal.

7. A mixer for use in a demodulation unit as claimed in claim 1, characterized in that the mixer is adapted to mix a quadrature input signal with a quadrature oscillator signal and to supply at least two mixed components.

8. A receiver comprising a complex input filter for converting the signal to be demodulated into a quadrature signal to be demodulated, characterized in that the receiver comprises a demodulation unit as claimed in claim 1.

9. A method of demodulating a quadrature input signal having at least two components, wherein a quadrature oscillator signal is supplied in dependence upon a control signal, and the quadrature input signal is mixed with the quadrature oscillator signal, and wherein at least two mixed components are supplied, comprising an in-phase component and a quadrature component, characterized in that the method further comprises the steps of dividing the in-phase component by the quadrature component and supplying the output signal as a control signal for generating the oscillator signal, and filtering one or more components and/or signals.

* * * * *